United States Patent
Kushch et al.

(10) Patent No.: US 6,527,548 B1
(45) Date of Patent: Mar. 4, 2003

(54) SELF POWERED ELECTRIC GENERATING SPACE HEATER

(75) Inventors: Aleksandr S. Kushch, Poway, CA (US); Daniel Allen, La Jolla, CA (US)

(73) Assignee: Hi-Z Technology, Inc., San Diego, CA (US)

( * ) Notice: Subject to any disclaimer, the term of this patent is extended or adjusted under 35 U.S.C. 154(b) by 0 days.

(21) Appl. No.: 10/176,312

(22) Filed: Jun. 20, 2002

(51) Int. Cl.$^7$ ................................................. F24H 1/00
(52) U.S. Cl. .................. 432/222; 432/223; 237/12.3 C; 123/142.5 R
(58) Field of Search ................. 432/222, 223; 237/12.3 C; 123/142.5 R

(56) References Cited

U.S. PATENT DOCUMENTS

| | | | | |
|---|---|---|---|---|
| 5,480,093 A | * | 1/1996 | Tochizawa et al. | 237/12.3 C |
| 5,892,656 A | * | 4/1999 | Bass | 136/203 |
| 6,082,625 A | * | 7/2000 | Faccone et al. | 237/12.3 C |
| 6,106,282 A | * | 8/2000 | Humburg et al. | 123/142.5 R |

* cited by examiner

Primary Examiner—Jiping Lu
(74) Attorney, Agent, or Firm—John R. Ross; John R. Ross, III

(57) ABSTRACT

A self-powered space heater. At least one thermoelectric module is sandwiched between a hot surface of a combustion chamber of a fluid fired space heater and a room air-cooled heat exchanger for transferring heat from the space heater to room air. A blower circulates room air through the heat exchanger for the dual purpose of heating the room air and also removing heat from the heat exchanger. In a preferred embodiment two thermoelectric modules are utilized in a diesel fuel fired space heater to provide heated air for the cab of a diesel truck. Spherical self-alignment washers are used in a compression frame to apply uniform compression force to both hot and cold sides of the thermoelectric modules. The two modules provide about 25 Watts output that is more than sufficient power to operate the heater that requires about 20 Watts. Extra power can be used for other purposes such as battery charging. The invention is also useful to provide self-power to heaters in vehicles other than truck and other space heaters such as pellet stoves and fireplaces.

21 Claims, 4 Drawing Sheets

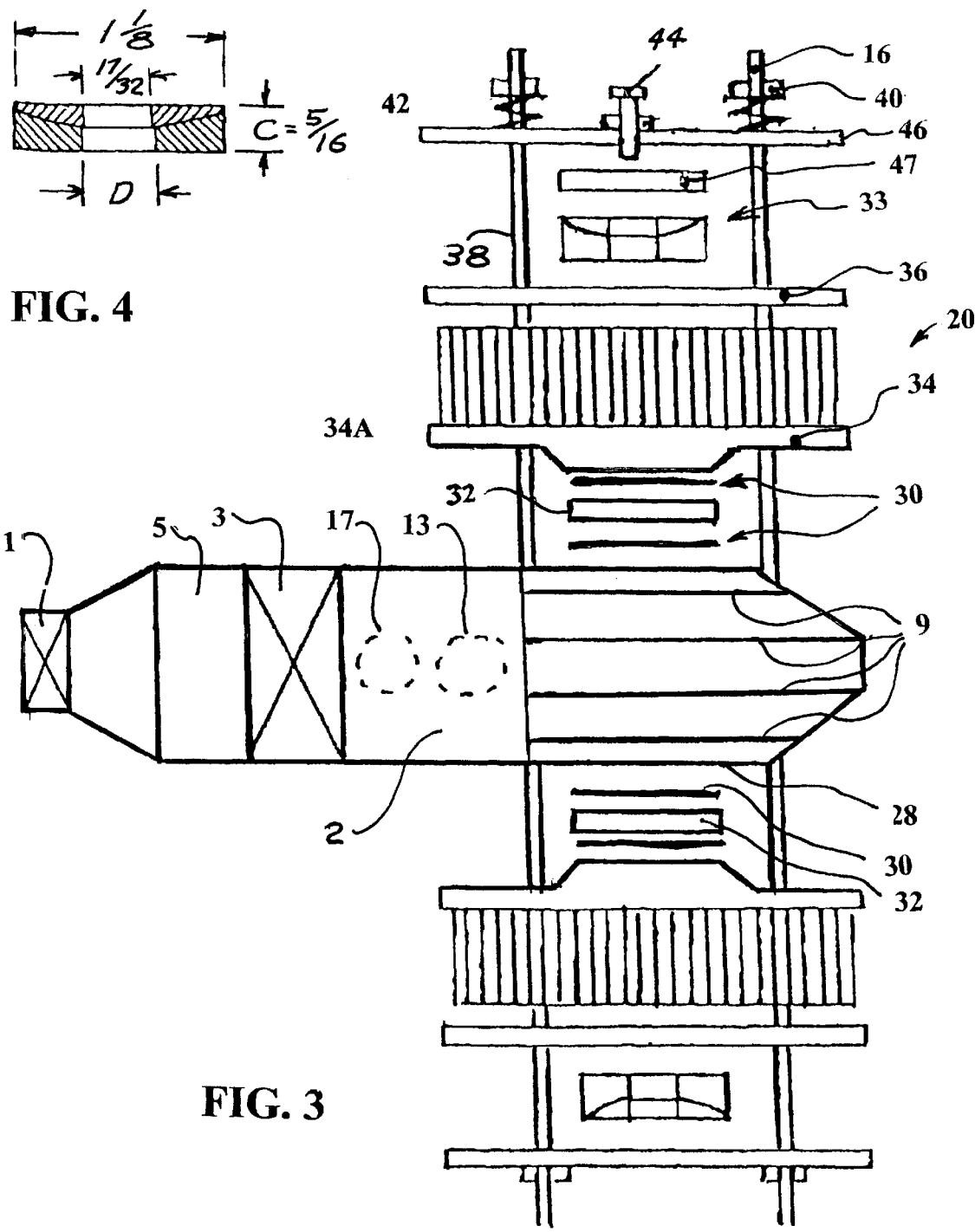

US 6,527,548 B1

SELF POWERED ELECTRIC GENERATING SPACE HEATER

This invention relates to space heaters and especially to self-powered heaters.

BACKGROUND OF THE INVENTION

Oil and gas stoves are used extensively for space heating. Many stoves designed for space heating are equipped with electrical components such as blowers for circulating room air and/or bringing in and/or exhausting combustion air. These electrical components are almost always powered by an external electric power source, normally utility power although it is known to power such components using electric power produced by thermoelectric elements driven by heat produced by the stoves.

Long distance truck companies often utilize trucks with sleeping compartments in the truck cab. About three percent of large trucks in the United States are equipped with a space heater operating with diesel or gasoline fuel to provide heat for the cab. The space heaters typically are equipped with electrical components pumping fuel to the space heater, for circulating room air through the space heater and the truck cab and for bringing in combustion air and for exhausting combustion products from the heater. The truck battery provides electric power for these units.

Thermoelectric devices are well known and have been commercially available for about 30 years. One such module is described in U.S. Pat. No. 5,892,656 that is incorporated herein by reference. Its dimensions are 2½ inches X 2½ inches X 0.2 inch and with a temperature difference of 360 degrees F will produce 14 Watts at 1.65 volts.

What is need is a compact self-powered liquid fuel space heater.

SUMMARY OF THE INVENTION

The present invention provides a self-powered space heater. At least one thermoelectric module is sandwiched between a hot surface of a combustion chamber of a fluid fired space heater and a room air-cooled heat exchanger for transferring heat from the space heater to room air. A blower circulates room air through the heat exchanger for the dual purpose of heating the room air and also removing heat from the heat exchanger. In a preferred embodiment two thermoelectric modules are utilized in a diesel fuel fired space heater to provide heated air for the cab of a diesel truck. Spherical self-alignment washers are used in a compression frame to apply uniform compression force to both hot and cold sides of the thermoelectric modules. The two modules provide about 25 Watts output that is more than sufficient power to operate the heater that requires about 20 Watts. Extra power can be used for other purposes such as battery charging. The invention is also useful to provide self-power to heaters in vehicles other than truck and other space heaters such as pellet stoves and fireplaces.

BRIEF DESCRIPTION OF THE DRAWINGS

FIG. 3 is a drawing of a portion of a preferred embodiment of the present invention.

FIG. 4 is a drawing of a spherical washer set.

DETAILED DESCRIPTION OF PREFERRED EMBODIMENTS

Space Heaters Are a Battery Drain

The primary reason for the relatively small number of space heaters in trucks is the requirement for electrical power for the electrical components of the heaters. Overnight usage of the heaters will often drain the truck batteries to the extent that the batteries are too weak to start the truck the next morning. Typically, drivers prefer to keep engines idling. This costs the United States about 838 million gallons of fuel per year along with the associated unnecessary air pollution and additional maintenance costs. The present invention solves this problem.

First Preferred Embodiment

Figure 1:
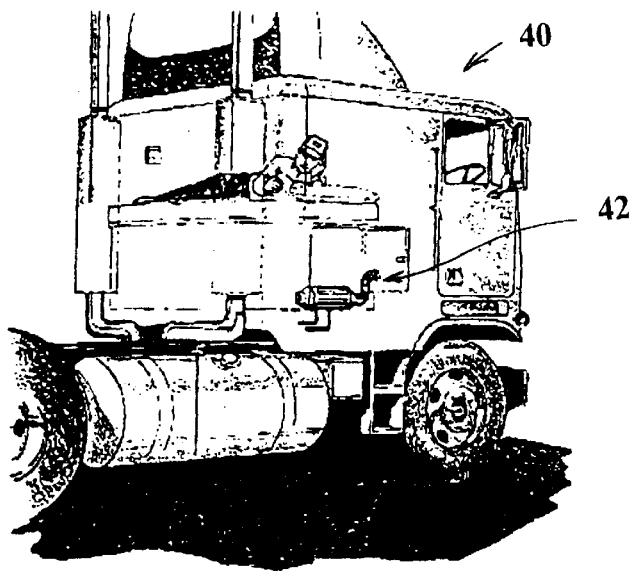
FIG. 1 is a drawing showing a prior art diesel truck cab with a diesel space heater.
Figure 2:
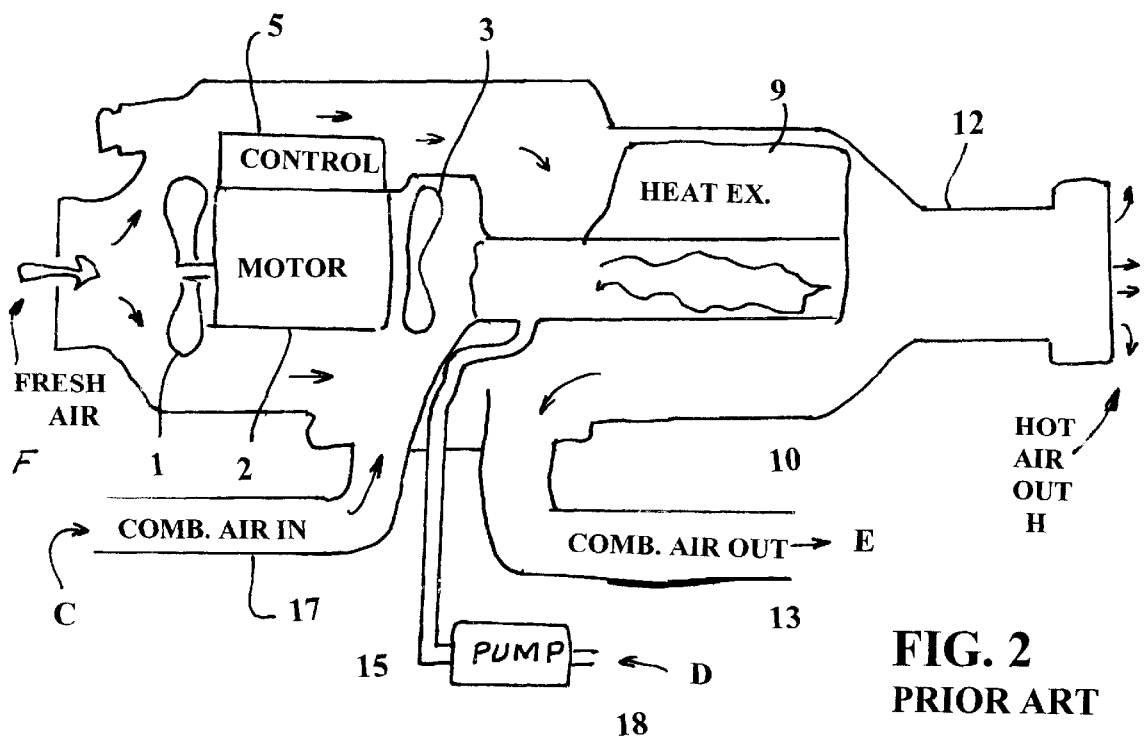
FIG. 2 is a cutaway drawing of the prior art heater.

FIG. 1 is a drawing showing a cab 40 of a large truck that is furnished with a diesel fired space heater 42. This prior art unit is sold commercially by Espar Products, Inc with offices in Mississauga, Ontario, Canada and in Livonia, Mich. A cutaway drawing of the unit is shown in FIG. 2. This unit at high heat output will produce 6,150 BTU/hr, thermal energy. The unit comprises several electrical components including a combustion air blower, a room air blower, ignition glow plugs as well as electrical controls and a fuel pump. The unit at high heat output requires 1.8 amps at 12V DC. The electrical power in the diesel truck embodiment utilizes electric power from the truck battery. As an alternative to running the truck engine (in as idling mode) to keep a sleeping driver warm, the unit provides a tremendous savings of fuel and wear on the engine and produces much less emissions into the environment. However, the unit is a substantial drain on the truck battery so its use is severely limited in terms of how long it can be operated without starting up the engine to charge the battery.

Applicants' Solution

Applicants have built and tested a diesel-fired electric generating space heater unit by modifying one of the Espar units shown in FIGS. 1 and 2. This modified unit is capable of not only providing the electric power needed to operate the electrical components of the space heater but also of providing additional electric power to charge the truck battery.

Details of Space Heater Unit

Important features of prior art space heater 42 are shown in cutaway drawing FIG. 2. The unit includes:

Hot air blower wheel 1,
Blower motor 2,
Combustion air blower wheel 3,
Control unit 5
Heat exchanger 9,
Combustion Chamber 10,
Outer casing 12,
Exhaust line 13,
Fuel line 15, Combustion air intake line 17, and Fuel metering pump 18.

Other features of this unit not shown are a glow plug, safety thermal sensor, flame monitor, thermostat, rheostat, main fuse and fuel strainer.

Combustion air enters at C, fuel enters at D, exhaust gasses leave at E, fresh air enters at F and hot air leaves at H.

Self Powered Unit

A self-powered diesel fired space heater unit 20 built and tested by Applicants is described by reference to FIG. 3. The unit comprises a modified version of the Espar D1LC Compact Air Heater. Outer casing 12 shown in FIG. 2 was removed and discarded and heat exchanger fins on both sides of the combustion chamber, shown as 9 in FIG. 2, were cut off. Aluminum was sprayed over the cut area and the sprayed aluminum was machined to provide a flat recessed surface about $2\frac{5}{8}$ inch X $2\frac{5}{8}$ inch and about $\frac{1}{8}$ inch deep. Two Hi-Z Model HZ-14 thermoelectric modules 32 were each sandwiched between the flat spots and a specially designed heat exchanger 34 as shown in FIG. 3. At high heat load at room air temperature (providing a temperature differential of about 200 degrees C across the modules) the two modules together produce about 26 Watts at about 3 Volts. A DC/DC converter increases the voltage to about 12 Volts with an efficiency of about 87 percent. The net power is more than enough to power the electrical components of the space heater with a small amount of excess electric power for charging the battery. When the unit is starting up a small amount of power is drained from the battery for about two minutes.

Extensive testing and modifications were required by Applicants before successively producing net electrical power from the unit. Applicants are aware of attempts by others to add thermoelectric modules to the Espar unit to make it self powered in a cost-effective design, but these efforts were not successful. Applicants achieved their success through repeated trial and error efforts and a good basic design. The details of Applicants' design are described below by reference to FIGS. 3, 4 and 5.

As stated above the modified Espar unit is shown at 20 in FIG. 3 that is a top view. The added elements are shown in exploded form. Shown by reference number are the location of hot air blower wheel 1, motor and control unit 2 and 5, combustion air blower 3, combustion intake line 17, exhaust line 13 and combustion chamber 7. The top fins of the original heat exchanger are shown at 9. As explained above the fins on both sides were cut off to produce flat surface 28. Flat surface 28 is covered with high-temperature conductive grease comprised of a mixture of Krylox oil 16350 available from DuPont and boron nitride available from Advanced Ceramics Inc. An aluminum wafer 30 that is 0.010 inch thick and 2.5 inch X 2.5 inch sits on the flat surface and both sides are covered with the above grease. Next is the Hi-Z model HZ-14 thermoelectric module 32. Next in line is another wafer 30 with grease on both sides. Next is pin type cast aluminum heat exchanger 34 that is described in detail below. On the pin side of heat exchanger 34 is steel plate 36 having dimensions of 0.25 inch X 6 inches X 6 inches.

The rest of the components shown in the exploded portion of FIG. 3 are provided to assure that there is excellent thermal contact on both sides of thermoelectric module 32. Early designs of Applicant were unsuccessful because the contact pressure was not sufficiently uniform over the faces of the module. The excellent uniform pressure is achieved by the design shown in FIG. 3. Applicants use a two-piece spherical steel washer set 33 available in the McMaster-Carr catalog. These washers are known as equalizing and self-aligning washers and fit together like a ball and socket. The set is $\frac{5}{16}$ inch thick and is shown in FIG. 4. The McMaster part number is 91944A470. Four threaded rods 38 are in tension to apply compressive force on both sides of modules 32. The tension is applied by tightening of nuts 40 compressing springs 42 that serve to keep the compressive force relatively constant over long periods. The tension force applied by rods 38 are converted to compressive force by bolt 44 that is threaded through metal beam 46 and is in contact with metal spacer 47 that in turn is in contact with the male washer of washer set 33. Applicants recommend that each of the four nuts 40 be tightened enough to apply a compressive force of 200 pounds per square inch to both sides of each of the two modules 32. Alumina felt insulation is packed around modules 32 and between the combustion chamber and heat exchanger 34.

Heat Exchanger

Heat exchangers 34 shown in FIG. 3 are cast aluminum, specially designed for use with thermoelectric modules 32. An extended section shown at 34A tapers to the same area to as that of the modules. The heat exchanger is comprised of 368 pins (eight rows of 25 pins and seven rows of 24 pins). The 24-pin rows alternate and are staggered with respect to the 25 pin rows so that air flowing through the pins is forced to flow in a weaving path around the pins. The heat exchanger is inexpensive to produce and provides an excellent heat sink for these modules.

Electrical Modifications

Figure 5:
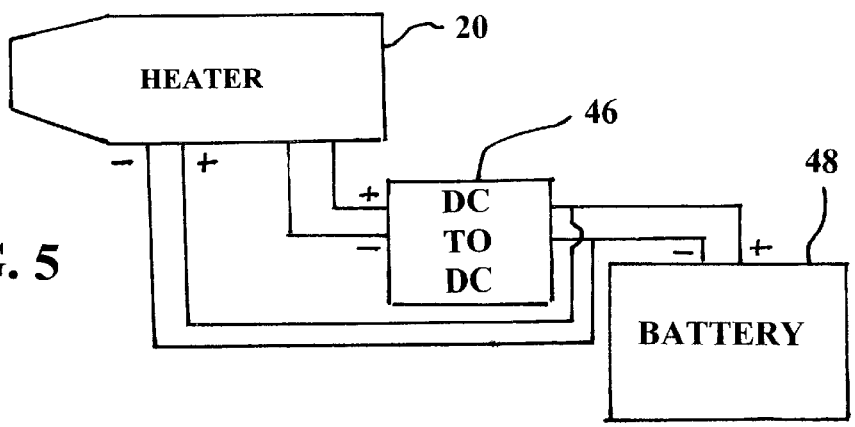
FIG. 5 shows some electrical features of the present invention.

FIG. 5 shows the electrical modification made by Applicants for this application. The modified Espar space heater with the thermoelectric module and heat exchangers is shown at 20. A special DC to DC converter 46 increases the voltage from the modules from about 3.3 Volts to about 12.7 Volts for charging of battery 48. As indicated in FIG. 5 if the output of converter 46 is at least sufficient to supply the electrical requirements of space heater 44 there is no drain on battery 48 and any excess energy from the converter charges the battery. When the space heater is just starting up it draws power from the battery.

DC to DC Converter

In this embodiment converter 46 is Model No. PT6673 supplied by Power Trends, Inc. with offices in Warrenville, Ill. Preferably, for the truck application the converter output voltage should be about 13–14 Volts, which is the range preferred for 12-Volt battery charging. This particular converter has an efficiency of about 87 percent.

Test Results

As indicated above Applicants first attempts were failures because the lack of uniform pressure distribution on the modules adversely affected the performance of the modules. The result was outputs of about one half of the predicted output. The frame unit applying compressive force was redesigned as explained above to assure uniform pressure distribution. The result with the design described above was excellent performance matching predicted output and the output exceeded the power requirements of the space heater. For example, with the heater unit at high heater output mode, Applicants measured temperature differences across the modules of about 200 degrees C and the modules delivered a total of about 26 to 27 Watts of power. This is substantially in excess of the approximately 21 to 22 Watts of electric power needed to power the heater.

The Unit Will Pay for Itself

The present invention is expected to add about $100 to the cost of space heater units such as the Espar Products unit referred to above to bring the total cost of the heater unit like the above preferred embodiment to about $1,200. Applicants estimate that the cost savings associated with the operation of the heater as compared to idling the truck engine is about $1.34 per hour, just for the difference in cost of diesel fuel consumed. (The fuel cost for an idling diesel truck is about $1.40 per hour but the cost to operate the heater is only about 0.063 per hour.) This savings is in addition to costs associated with wear and tear on the engine and the environmental costs relating to the diesel engine exhaust.

Belleville Washers

Appropriate balanced compression can also be applied to modules using the Belleville washers instead of the compression springs 42. Such an embodiment is explained in FIG. 5. In this case a frame similar to the one shown in FIG. 3 is provided but the frame 50 is rigid. In this case compressive bolt 51 applies compressive force to Belleville washers 52 which in turn applies a relatively constant pressure (notwithstanding substantial temperature variations) to self alignment spherical washers 33 which assures that the compressive force is distributed uniformly over the surfaces of thermoelectric module 30.

Other Self Powered Space Heaters for Vehicles

Persons skilled in this art will recognize that there are many other applications of the present invention other than heating the cab of a truck. Obviously, the present invention could be utilized effectively on all types of motor vehicles, especially long distance vehicles where passengers will want to sleep in the vehicles. This would include motor homes, buses, vans, sport utility vehicles and even automobiles. Also, in very cold climates this invention could be applied to engine pre-heaters.

Other Space Heaters

The present invention may also be used in situations other than in vehicles. The invention provides special advantages where a space heater is already installed but no provision has been made for circulating the heat generated by the space heater.

Fluid Fired Fire Places

An important application of the present invention is fluid fired fireplaces. These include fuel oil fired fireplaces and natural gas fired fireplaces. The fuel oil fired fireplace would utilize all of the features shown in the drawings for the cab heater. In this case a fuel pump is needed as well as a room air blower. In this case however one face (the front side) of the combustion chamber is open to the room. Preferably two thermoelectric modules are mounted on a metal frame which encloses the fire on the other three sides (the back-side and the two other sides). The thermoelectric modules are mounted on the back-side of the frame on each of the three sides. A finned heat exchanger such as heat exchanger 34 shown in FIG. 3 is mounted on the cold side of the thermoelectric module and is held tightly in place in good thermoelectric contact using the arrangement shown in FIG. 3. The electric power provided by the thermoelectric modules powers one or more room air blowers as well as a fuel pump. Ductwork is preferably provided to pull room air out of the room through the fins of the heat exchangers then back out to the room. The ductwork preferably is designed so that no significant cooling is provided of the portion of the metal frame in contact with the modules and maximum cooling of the heat exchangers. In addition the ductwork should be designed for maximum transfer of heat from the walls of the frame into the room. Appropriate use of fins on the frame can improve the effectiveness of the circulating room air in this heat transfer. In preferred embodiments a blower provides a controlled amount of combustion air based on the fuel being consumed to assure the most efficient combustion. This could be done using some of the differential pressure provided by the room air blower or blowers or by a separate blower. In some embodiments the combustion air blower may be eliminated where natural draft from the room and up the chimney is considered adequate.

Natural Gas Fireplaces

Natural gas fireplaces have become very popular during the past few years. They are very attractive and are much less polluting that wood burning fireplaces. However, they are very inefficient. Most of the heat goes up the chimney. The present invention can improve the efficiency of these fireplaces without using any utility electric power. In this case the fuel pump is not needed since the natural gas comes into the home under pressure.

Heat Management in Fireplace Design

Figure 6:
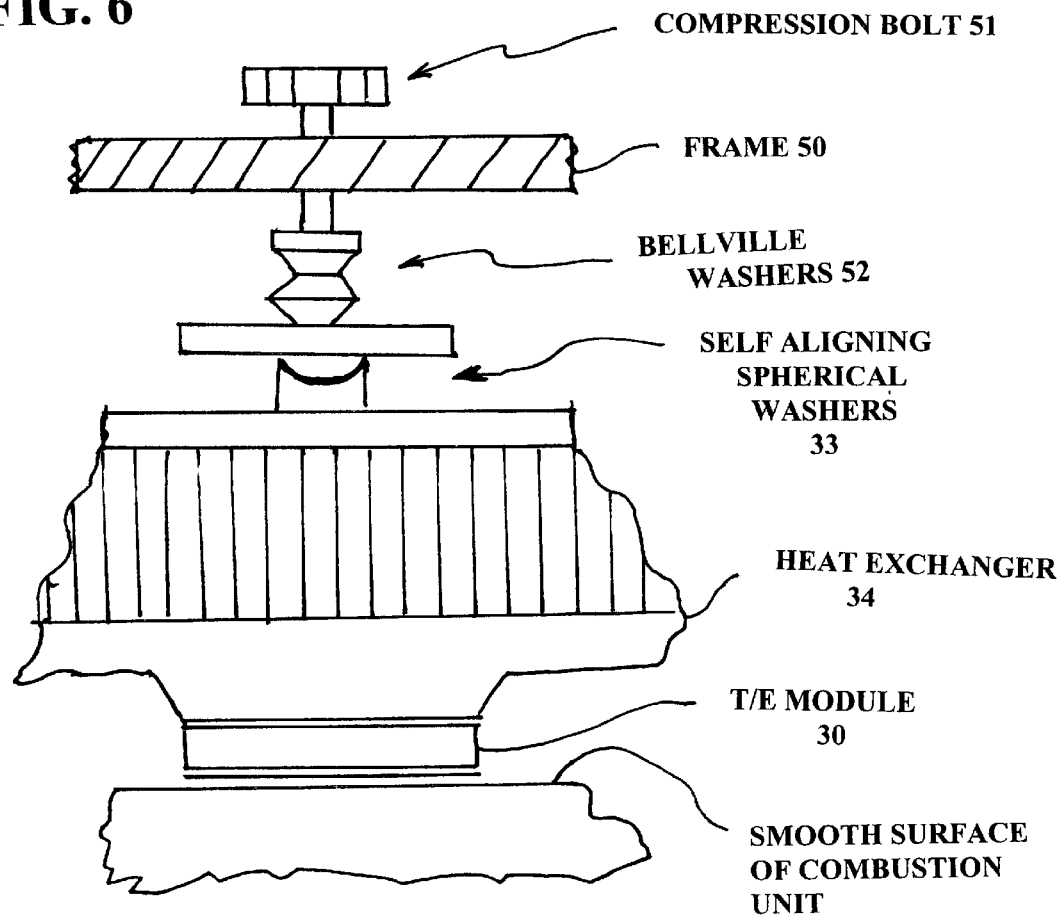
FIG. 6 demonstrates the use of Belleville washers for providing even distribution of compressive forces on a thermoelectric module.
Figure 7:
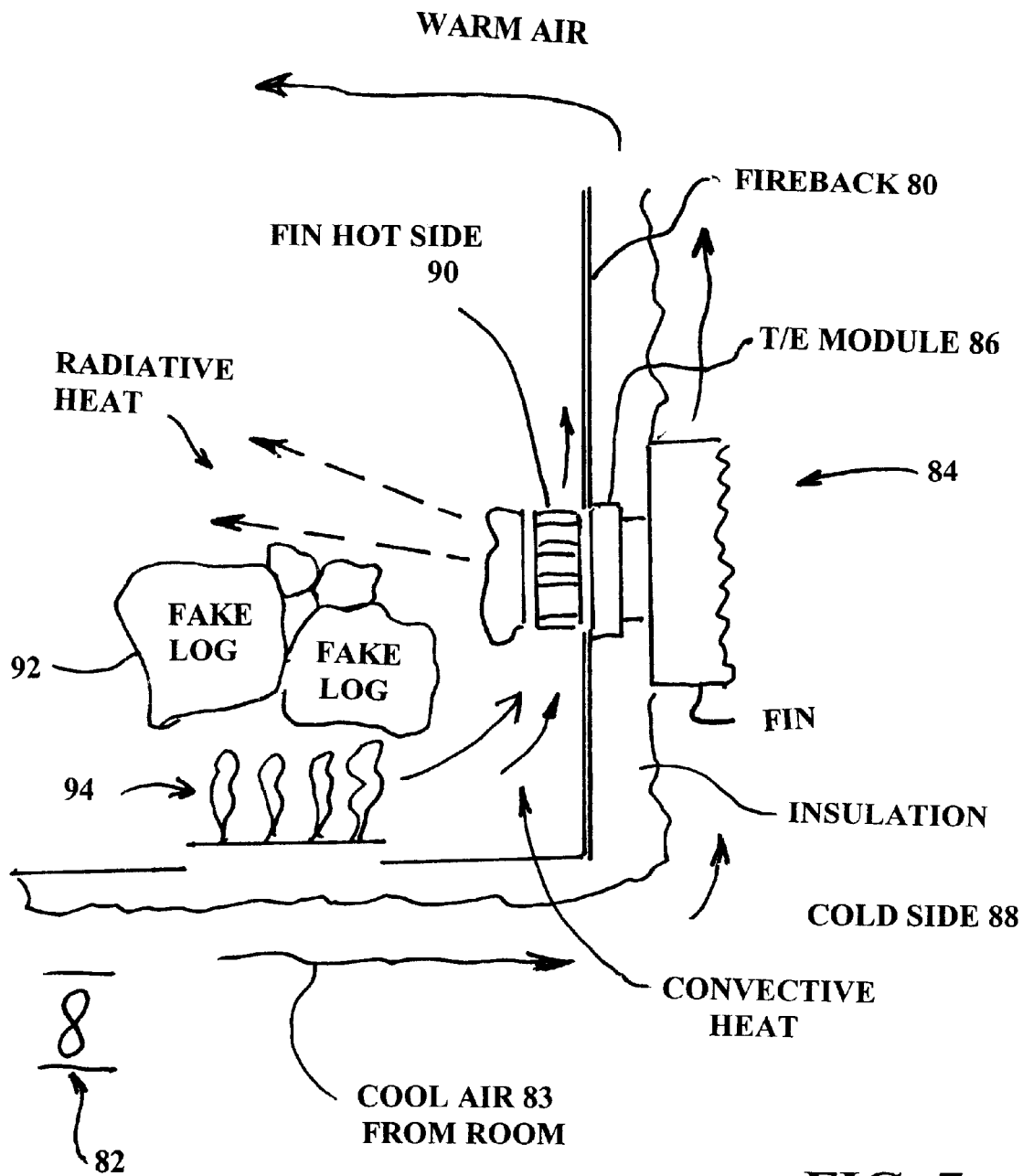
FIG. 7 shows features of a self-powered fireplace.

Preferably, in the course of integrating the thermoelectric power into the fireplace, issues of heat management should also be taken into consideration. That is, the thermoelectric assembly should take on an added function of reflecting or re-radiating thermal radiative heat at the same time it functions to capture convective heat and concentrate that heat for transfer to the hot side of the thermoelectric module. FIG. 7 is a sketch of elements of a natural gas fired fireplace with a thermoelectric power source. The thermoelectric modules are mounted against the backside of the metal fireback 80, which forms a boundary on three sides of the fireplace. A fan 82 pulls cool room air 83 around the back side of fireback 80 to provide cooling for the cold side heat exchanger of thermoelectric unit 84 which includes thermoelectric module 86, cold side fins 88 and hot side fins 90. The fireplace also includes fake logs 92 and natural gas flames 943. In another preferred embodiment burners can be provided directly below hot side fins 90. Preferably the thermoelectric module 86 is compressed between the cold side heat exchanger and hot side heat exchanger using a type of compression described above and shown in FIG. 6 or FIG. 3. The fireplace could be designed so that a flame under the fins was always sufficient to provide enough heat to produce enough power to operate essential equipment. It is important in these fireplace designs that a natural look be preserved so that the thermoelectric heat exchange elements should have the look of a log or other old fashion fire place equipment such as iron log holders.

Wood Pellet Stoves

Another excellent application of the present invention is to self-power wood pellet stoves. Wood pellets about ¼ inch in diameter and about ⅝-inch long fuel these stoves. These pellets are driven into the combustion unit by a mechanical screw type device that is powered by electric power. Blowers also powered by electric power circulate room air through the stove. In the prior art these stoves get their electric power from the utility grid. The present invention can provide that power free of charge! The features shown in FIG. 3 can be utilized; however, instead of the liquid fuel pump, in this case the electric power from the thermoelectric modules will power the mechanical pellet pump.

While the above description has dealt with a single preferred embodiment of the present invention, the reader should understand that many modifications could be made and still be within the scope of the invention. For example, more than two thermoelectric generating units could be utilized. If 8 units were used, 12 volts could be provided and the DC to DC converter could be eliminated. Four units would provide about 32 Watts excess power that could be enough to permit the driver to operate various electrical devices such as a small television or CD player while he relaxes in his cab. The four tension rods and compression springs could be replaced with three of each. The present invention can be applied with other fluid fuel sources such as gasoline or natural gas and utilized to heat spaces other than truck cab. Therefore, the attached claims and their legal equivalents should determine the scope of the invention.

We claim:

1. A self-powered liquid fuel space heater comprising:
   A) a combustion chamber defining an outside surface,
   B) an electric powered fluid fuel pump for pumping fluid fuel to the combustion chamber,
   C) an electric powered combustion air blower for blowing air into said combustion chamber,
   D) one or more room air cooled heat exchangers,
   E) one or more thermoelectric modules each module defining a hot side and a cold side,
   F) an electric powered room air blower for blowing room air through said at least one heat exchanger to cool said heat exchanger and to provide space heat to a room,
   G) electronic controls, and
   H) a compression frame for compressing said at least one module between said at least one heat exchanger and said room air cooled heat exchanger, said compression frame comprising an alignment device for producing uniform compression force on both the hot side and the cold side of each of said at least one thermoelectric module;
   wherein said one or more thermoelectric module provide at a high heat mode sufficient electric power to operate said electric controls, said fuel pump, said combustion air blower, and said room air blower.

2. The space heater as in claim 1 wherein said one or more thermoelectric modules in two thermoelectric modules.

3. The space heater as in claim 1 wherein said one or more thermoelectric modules in two thermoelectric modules and said one or more heat exchangers is two heat exchangers.

4. The space heater as in claim 1 wherein said alignment device comprises a set of spherical alignment washers aligned with a central region of at least two said thermoelectric modules.

5. The space heater as in claim 4 wherein said compression frame comprises at least three tension elements and at least three compression elements.

6. The space heater as in claim 5 wherein said at least three tension elements are at least three tension rods and said at least three compression elements are at least three compression springs.

7. The space heater as in claim 6 wherein said at least three tension rods are four tension rods and said at least three compression springs are four compression springs.

8. The space heater as in claim 5 wherein said alignment device further comprises a force element for applying a compressive force to said set of spherical alignment washers, said compressive force being produced by said at least three tension rods and said at least three compression springs.

9. The space heater as in claim 7 wherein said alignment device further comprises a force element for applying a compressive force to said set of spherical alignment washers, said compressive force being produced by said four tension rods and said four compression springs.

10. The space heater as in claim 1, wherein said at least one thermoelectric module comprises:
    A) a crate having the form of an eggcrate defining a plurality of thermoelectric element spaces,
    B) a plurality of p-type thermoelectric elements,
    C) a plurality of n-type thermoelectric elements, said p-type and said n-type thermoelectric elements being positioned in said thermoelectric element spaces,
    D) a metallized coating on said cold surface connecting p-type thermoelectric elements to n-type thermoelectric elements on said cold surface,
    E) a metallized coating on said hot surface connecting p-type thermoelectric elements to n-type thermoelectric elements on said hot surface,
    wherein the position of said p-type and said n-type elements, the configuration of said crate having the form of an eggcrate and said metallized coatings being effective to cause a plurality of said thermoelectric elements to be electrically connected in series.

11. The space heater as in claim 1 and further comprising an electric circuit, wherein said electric circuit provides electric power to an external load.

12. The space heater as in claim 11, wherein said external load comprises a rechargeable battery.

13. The space heater as in claim 1 wherein said fluid pump is a diesel fuel pump and said fluid fuel is diesel fuel.

14. The space heater as in claim 1 wherein said fluid pump is a gasoline fuel pump and said fluid fuel is gasoline.

15. The space heater as in claim 1 wherein said heater is configured to heat a truck cab.

16. The space heater as in claim 1 wherein said heater is configured to heat mobile home.

17. The space heater as in claim 1 wherein said heater is configured to heat a bus.

18. The space heater as in claim 1 wherein said heater is configured to heat an automobile.

19. A self-powered space heater comprising:
    I) a combustion chamber defining an outside surface,
    J) an electric powered combustion air blower for blowing air into said combustion chamber,
    K) one or more room air cooled heat exchangers,
    L) one or more thermoelectric modules each module defining a hot side and a cold side,
    M) an electric powered room air blower for blowing room air through said at least one heat exchanger to cool said heat exchanger and to provide space heat to a room,
    N) electronic controls, and
    O) a compression frame for compressing said at least one module between said at least one heat exchanger and said room air cooled heat exchanger, said compression frame comprising an alignment device for producing uniform compression force on both the hot side and the cold side of each of said at least one thermoelectric module;

wherein said one or more thermoelectric module provide at a high heat mode sufficient electric power to operate said electric controls said combustion air blower, and said room air blower.

20. A space heater as in claim 19 wherein the space heater is apellet stove.

21. A space heater as in claim 19 wherein the space heater is a fireplace.

* * * * *